United States Patent [19]
Fallon et al.

[11] Patent Number: 5,923,090
[45] Date of Patent: Jul. 13, 1999

[54] MICROELECTRONIC PACKAGE AND FABRICATION THEREOF

[75] Inventors: Kenneth Michael Fallon, Rochester; William Hsioh-Lien Ma, Fishkill, both of N.Y.

[73] Assignee: International Business Machines Corporation, Armonk, N.Y.

[21] Appl. No.: 08/848,718

[22] Filed: May 19, 1997

[51] Int. Cl.$^6$ .................................................. H01L 23/48
[52] U.S. Cl. ...................... 257/777; 257/723; 257/778; 257/787; 438/108; 438/127
[58] Field of Search .................................. 257/777, 778, 257/723, 787; 438/107, 108, 127

[56] References Cited

U.S. PATENT DOCUMENTS

| | | | |
|---|---|---|---|
| 4,697,095 | 9/1987 | Fuji ........................................... | 257/777 |
| 5,095,402 | 3/1992 | Hernandez et al. ..................... | 361/306 |
| 5,323,060 | 6/1994 | Fogal et al. .............................. | 257/777 |
| 5,444,296 | 8/1995 | Kaul et al. ................................ | 257/686 |
| 5,481,133 | 1/1996 | Hsu .......................................... | 257/621 |
| 5,502,667 | 3/1996 | Bertin et al. .............................. | 365/51 |
| 5,532,512 | 7/1996 | Fillion et al. ............................. | 257/686 |
| 5,646,828 | 7/1997 | Degani et al. ........................... | 257/778 |
| 5,818,107 | 10/1998 | Pierson et al. ........................... | 257/777 |

FOREIGN PATENT DOCUMENTS 6-112402   4/1994   Japan .

*Primary Examiner*—Peter Toby Brown
*Assistant Examiner*—Roy Potter
*Attorney, Agent, or Firm*—Pollock, Vande Sande & Amernick; John R. Pivnichny

[57] ABSTRACT

An electronic package comprising an integrated circuit chip and a flip chip solder bonded thereto is provided. The integrated circuit chip has circuitry over a major surface thereof and has peripheral wire or tab bond pads surrounding an array of C4 connection pads located over this major surface. A flip chip is solder bonded to the C4 connection pads.

16 Claims, 1 Drawing Sheet

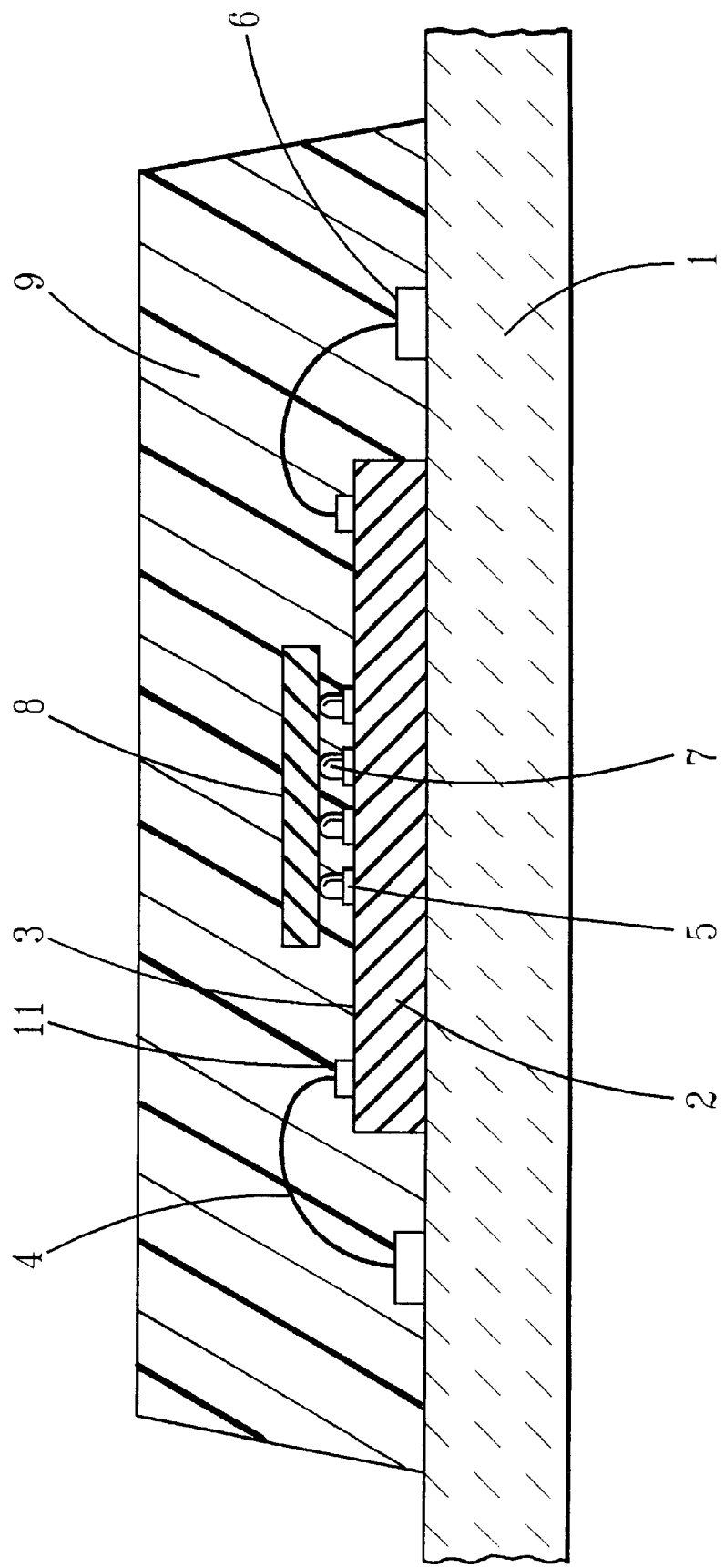

MICROELECTRONIC PACKAGE AND FABRICATION THEREOF

DESCRIPTION

TECHNICAL FIELD

The present invention is concerned with an integrated circuit chip package and is especially concerned with a multiple chip package having a piggy-back chip arrangement. Moreover, the present invention is concerned with a method for fabricating such integrated circuit chip package.

BACKGROUND ART

Significant advancement has occurred over the years in electronic development and packaging. Integrated circuit density has and continues to increase at a considerable rate. By way of example, high density electronic packaging module having multiple semiconductor chips thereon are quite popular.

One particular arrangement that has been generating interest is a package that permits the integration of logic and memory devices on the same silicon device. However, this arrangement requires larger devices, and has resulted in increased loss in wafer yield. In particular, memory devices generally are of relatively high yield because of the redundancy built into them. Logic devices, on the other hand, are of relative low yield. Accordingly, combining them on the same silicon wafer results in overall yield dependent upon the lower yield of the logic device portion. Accordingly, there remains room for improvement in electronic packaging, especially when combining logic and memory devices.

SUMMARY OF INVENTION

The present invention is concerned with an electronic package that overcomes problems associated with prior art packaging. In particular, the present invention is especially applicable to overcoming those problems encountered in integrating a memory and logic chip into a single device or silicon on silicon module. The present invention makes it possible to keep the size or real estate at a minimum and maintain yields as high as possible. In particular, the present invention is concerned with an electronic package that comprises an integrated circuit chip having circuitry over a major surface thereof, and having peripheral wire or tab bond pads on the major surface having the circuitry. In addition, the integrated circuit chip contains an array of C4 connection pads located over this major surface. The wire or tab bond pads surround this array of C4 connection pads. One or more flip chips are solder bonded to the C4 connection pads, resulting in a multi-chip package having a piggy-back chip arrangement. The chips according to the present invention are mounted face-to-face, with only the integrated circuit chip being connected to the underlying printed circuit board or card. The flip chip is connected to the integrated circuit chip but not individually connected to the printed circuit board or card.

The above electronic package can be fabricated by providing an integrated circuit chip having circuitry over a major surface thereof, peripheral wire or tab bond pads on this major surface, and an array of C4 connection pads located over this surface, wherein the wire or tab bond pad surround the array of C4 connection pads; and solder bonding at least one flip chip to the C4 connection pads on the integrated circuit chip. The C4 pads are typically formed by chemical vapor deposition on the integrated circuit chip.

Still other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF DRAWING

The drawing is a schematic diagram of an electronic package according to the present invention.

BEST AND VARIOUS MODES FOR CARRYING OUT INVENTION

In order to facilitate an understanding of the present invention, reference will be made to the drawing. In particular, numeral 1 represents a printed circuit board or card to which is attached integrated circuit chip 2. The printed circuit board or card 1 is typically constructed of a ceramic or an organic polymeric material, such as conventional FR 4 epoxy and laminates based on high temperature resins, such as high temperature epoxies, polyimides, cyanates (triazines), fluoropolymers, benzocyclobutenes, polyphenylene sulfides, polysulfones, polyetherimides, polyetherketones, polyphenylquinoxalines, polybenzoxazoles, and polyphenylbenzozobisthiazoles. Integrated circuit chip 2 includes circuitry located on its upper major surface 3. By way of example, integrated circuit chip 2 is a logic or processor device. Attached to surface 3 of integrated circuit chip are wire bond pads 11 to which are connected wires 4. It being understood that instead of wires 4, it is possible to use tape automated bonding (TAB). Also located on integrated circuit 2 on surface 3 is an array of C4 connection pads 5. The C4 connection pads must be solderable and are typically copper or NiAu. The wire 4 is typically a gold wire or aluminum wire. The bond pads 11 are typically aluminum or gold. The wire or tab pads surround the array of C4 connections. The wire or tabs are then connected to the printed circuit board or card 1 via a conductive pad 6, such as a gold or palladium pad, or via a lead frame as well known in the art.

An integrated flip chip 8 is bonded to the integrated circuit chip 2 through the C4 connection pads employing solder typically in the form of bumps or balls 7. C4 connection refers to controlled collapse chip connection or flip-chip technology, which is a face down bonding of semiconductor chips to a carrier. Concerning flip-chip technology, see U.S. Pat. Nos. 3,401,126 and 3,429,040 to Miller and assigned to the Assignee of the present application. The solder employed is typically a 97 Pb/3 Sn alloy, a 95 Pb/5 Sn alloy, or a 67 Sn/37 Pb eutectic. The flip-chip device 8 in this example can be a memory device and as shown will be smaller, widthwise, then integrated circuit 2. This provides the needed area for the bonding pads and wire or tabs on surface 3 of integrated circuit 2.

Although this example illustrates a processor chip as 2 and a memory chip as the other, the techniques of the present invention can just as well employ as integrated circuit chip 2 a memory device, and use a processor chip as the flip chip 8.

The flip-chip device 8 is typically soldered to integrated circuit chip 2 prior to the wire bond or tab attachment to the printed circuit board or card 1. This permits testing of the device 8 and circuit chip 2 and reworking, if necessary, prior to assembling to the printed circuit board or card 1.

Also, if desired, the entire package can be hermetically sealed in an encapsulant 9. The composite can be placed in a mold into which is placed a dielectric encapsulating composition, such an epoxy composition. Typical suitable encapsulants are disclosed in U.S. Pat. Nos. 4,235,620; 4,592,944; and 4,818,812, disclosures of which are incorporated herein by reference.

In this disclosure, there are shown and described only the preferred embodiments of the invention, but, as aforementioned it is to be understood that the invention is capable of use in various other combinations and environments and is capable of changes or modifications within the scope of the inventive concept as expressed herein.

What is claimed is:

1. An electronic package comprising an integrated circuit chip having circuitry over a major surface thereof and having peripheral wire or tab bond pads on said major surface, an array of C4 connection pads located on said major surface, and wherein said wire or tab bond pads surround said array of C4 connection pads; and a flip chip solder bonded to said C4 connection pads and which further includes an encapsulant to hermetically seal said integrated circuit chip and said flip chip.

2. The electronic package of claim 1 wherein said flip chip is smaller width wise than said integrated circuit chip.

3. The electronic package of claim 1 wherein said integrated circuit chip is wire or tab bonded to pads on lead frames or pads on a substrate.

4. The electronic package of claim 1 wherein one of said integrated circuit chip or said flip chip is a processor chip and the other of said integrated circuit chip or flip chip is a memory chip.

5. The electronic package of claim 1 wherein said integrated circuit chip is a processor chip and said flip chip is a memory chip.

6. The electronic package of claim 1 wherein said encapsulant is an epoxy.

7. A method for fabricating the electronic package of claim 1 which comprises providing an integrated circuit chip having circuitry on a major surface thereof, peripheral wire or tab bond pads, and an array of C4 connection pads located on said major surface, and wherein said wire or tab bond pads surround said array of C4 connection pads; and solder bonding a flip chip to said C4 connection pads.

8. The electronic package of claim 1 which further comprises a printed circuit board or card underlying the integrated circuit chip and wherein the integrated circuit chip is connected to the printed circuit board or card.

9. The electronic package of claim 2 wherein one of said integrated circuit chip or said flip chip is a processor chip and the other of said integrated circuit chip or flip chip is a memory chip.

10. The electronic package of claim 2 wherein said integrated circuit chip is a processor chip and said flip chip is a memory chip.

11. The method of claim 7 wherein said flip-chip is solder bonded to said C4 connection pads prior to providing wire bonding or tab attaching to an integrated circuit board or card.

12. The method of claim 7 wherein the flip chip is smaller width wise than the integrated circuit chip.

13. The method of claim 7 which further comprises wire or tab bonding the integrated circuit chip to pads on lead frames or pads on an organic substrate.

14. The method of claim 7 wherein one of the integrated circuit chips or the flip chips is a processor chip and the other of the integrated circuit chips or flip chips is a memory chip.

15. The method of claim 7 wherein the integrated circuit chip is a processor chip and the flip chip is a memory chip.

16. The electronic package of claim 8 wherein the flip chip is not directly connected to the printed circuit board or card.

* * * * *